United States Patent
Graham et al.

(10) Patent No.: US 10,763,079 B1
(45) Date of Patent: Sep. 1, 2020

(54) FOCUSED ION BEAM IMPURITY IDENTIFICATION

(71) Applicant: FEI Company, Hillsboro, OR (US)

(72) Inventors: Jeremy Graham, Hillsboro, OR (US); Lukas Kral, Ivancice (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/279,837

(22) Filed: Feb. 19, 2019

(51) Int. Cl.
  *H01J 37/30* (2006.01)
  *G01N 23/2251* (2018.01)
  *H01J 37/28* (2006.01)

(52) U.S. Cl.
  CPC ...... *H01J 37/3002* (2013.01); *G01N 23/2251* (2013.01); *H01J 37/28* (2013.01)

(58) Field of Classification Search
  CPC ... H01J 37/3002; H01J 37/28; G01N 23/2251
  See application file for complete search history.

(56) References Cited

U.S. PATENT DOCUMENTS

2002/0121594 A1* 9/2002 Wang ............... H01J 49/004
                                                         250/281

* cited by examiner

*Primary Examiner* — Nicole M Ippolito
*Assistant Examiner* — Hanway Chang
(74) *Attorney, Agent, or Firm* — Klarquist Sparkman, LLP

(57) ABSTRACT

A dual beam system having a charged particle beam (CPB) lens and an ion beam column can operate in an analysis mode. In the analysis mode, an ion beam from the ion beam column can be deflected by the CPB into one or more component beams including a primary ion beam and one or more non-primary ion beams. The dual-beam system can identify the ion species of the non-primary ion beams.

20 Claims, 11 Drawing Sheets

US 10,763,079 B1

FOCUSED ION BEAM IMPURITY IDENTIFICATION

FIELD

The disclosure pertains to apparatus and methods for the detection of impurities within an ion beam.

BACKGROUND

Charged particle beam systems are used in a variety of applications, including the manufacturing, repair, and inspection of miniature devices, such as integrated circuits, magnetic recording heads, and photolithography masks. Dual-beam systems typically include a scanning electron microscope (SEM) that can provide a high-resolution image with minimal damage to the target, and an ion beam system such as a focused or shaped beam system, that can be used to alter substrates (e.g., by milling) and to form images.

Generally, the final lens of an SEM produces a magnetic field which can alter the trajectory of the ion beam and can also interfere with various other functions of the dual-beam system. For example, an image or information about the composition of the substrate can be obtained by collecting secondary particles ejected as the primary ion beam strikes target, however, the magnetic field of the SEM changes the path of the secondary particles and makes them difficult to collect. Typically, the solution to this problem is to turn off the SEM when using the ion beam or when using certain functions of the ion beam.

Focused ion beams (FIBs) mill by sputtering, that is, physically removing atoms and molecules from the substrate surface. FIB systems generally operate by directing a focused beam of ions over the surface of a substrate, typically in a raster pattern. The ions are typically extracted from a liquid metal ion source (LMIS) or a plasma source. The extracted ions are accelerated and focused onto the substrate using a series of apertures and electrostatic lenses.

When using FIBs, it is desirable that the beam be free of impurities that can potentially damage the substrate. Accordingly, there is a continuing need for improved dual beam systems.

SUMMARY

Systems comprise a charged particle beam (CPB) magnetic lens configured to operate in an analysis mode and an imaging mode and an ion beam column configured to direct an ion beam to a substrate. A lens driver is coupled to the CPB magnetic lens. In the analysis mode, the CPB magnetic lens is energized to deflect the ion beam into one or more component beams, and in the imaging mode, the CPB magnetic lens is associated with imaging of the substrate. In some examples, the CPB is an electron beam. In other examples, in the analysis mode, the lens driver is configured to apply an analysis excitation and in the imaging mode, the lens driver is configured to apply an imaging excitation that is greater than the analysis excitation. In typical examples, the imaging excitation has a magnitude that is at least 10 times a magnitude of the analysis excitation. In other embodiments, an ion beam collector is situated to selectively receive individual component beams of the ion beam and an actuator coupled to the ion beam collector and configured to move the ion beam collector to receive individual component beams of the ion beam. In some examples, the ion beam collector is a Faraday cup and the lens driver is operable to provide a plurality of analysis excitations to the CPB magnetic lens. In further examples, the ion beam collector includes an aperture plate defining an aperture that is transmissive to the selectively directed one or more ion beam components. In some cases, a controller is coupled to the lens driver to select either the analysis excitation or the imaging excitation for the CPB magnetic lens. In other examples, an ion beam detector and an actuator are provided, wherein the controller is coupled to the ion beam detector and the actuator. Based on at least one current in the ion beam collector, a composition of a component of the ion beam is determined. In further examples, the system controller is further configured to estimate beam currents associated with at least one of the ion beam components. In still other embodiments, the controller is configured to selectively operate the CPB magnetic lens in the imaging mode and the analysis mode, and scan a movable aperture in the analysis mode. In a particular example, a gas manifold is coupled to the ion source and configured to selectively provide one or more gases to the ion source to produce one or more corresponding ion beam components.

Methods comprise directing an ion beam to a substrate and operating a CPB magnetic lens in an analysis mode to selectively deflect at least one beam component of the ion beam. A current or composition associated with the at least one deflected beam component is identified. Alternatively, the presence of one or more beam components is identified. In other examples, an image excitation is applied in the imaging mode and an analysis excitation is applied in the analysis mode, wherein a magnitude of the imaging excitation is at least ten time greater than a magnitude of the analysis excitation. In some alternatives, the ion beam is deflected into one or more component beams in response to the analysis excitation in the analysis mode and a location of at least one deflected component beam is measured. In some cases, locations and currents associated with a plurality of deflected component beams are measured. Typically, some or all of the measured locations are associated with respective charge to mass ratios. In a representative example, in the analysis mode, the ion beam is operated to mill a substrate in locations corresponding to respective component beams, and the component beams are identified based on the milled spots. In other examples, in the analysis mode, a magnitude of an analysis excitation is varied and at least one component of the ion beam is identified based on a corresponding magnitude of the analysis excitation.

The foregoing and other objects, features, and advantages of the disclosed technology will become more apparent from the following detailed description, which proceeds with reference to the accompanying figures.

DETAILED DESCRIPTION

Introduction

Figure 1A:
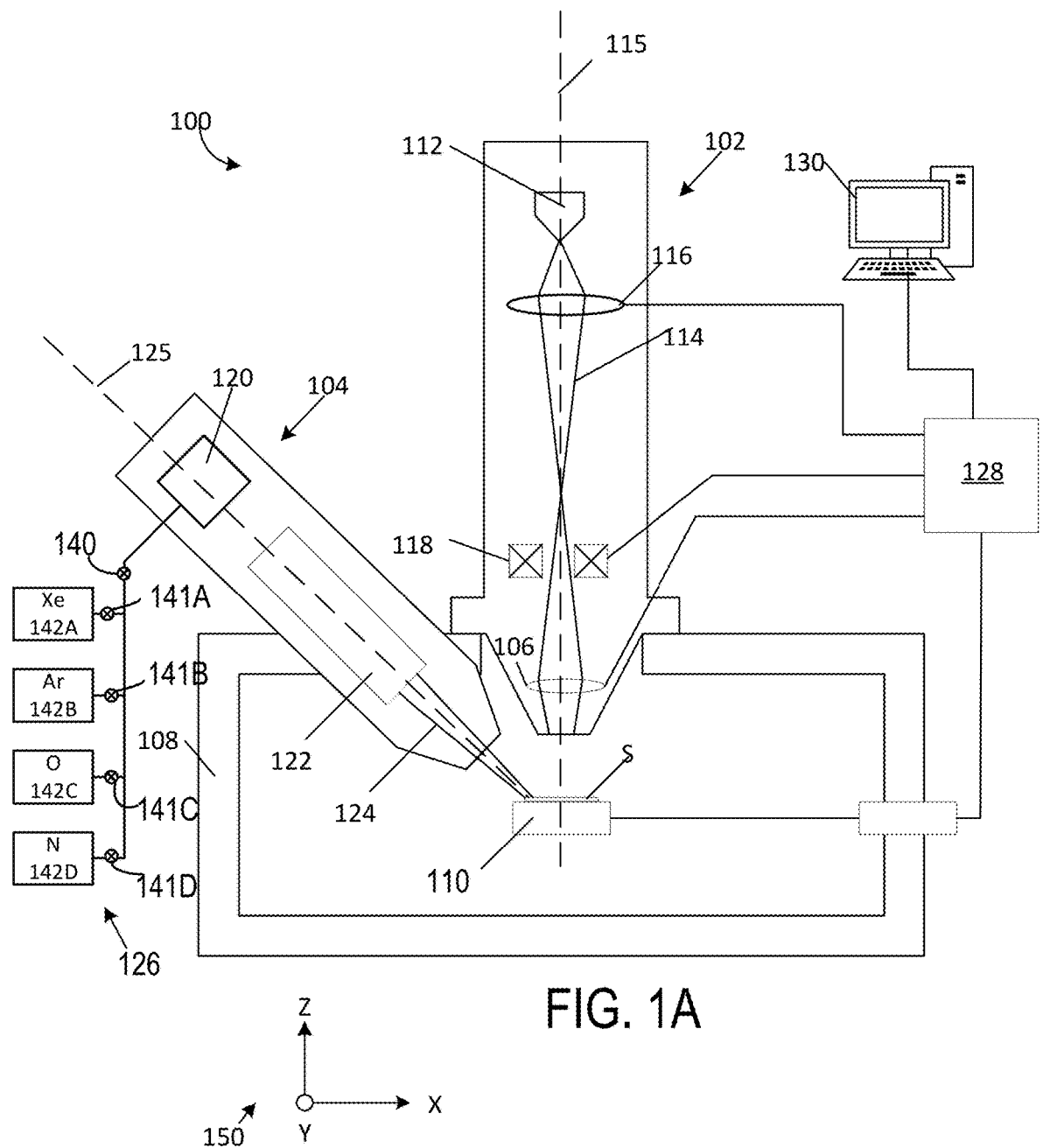
FIG. 1A illustrates a representative dual-beam system for performing ion beam analysis.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example.

In an SEM, irradiation of a substrate by a scanning electron beam produces "auxiliary" radiation from the substrate, in the form of secondary electrons, backscattered electrons, X-rays, and cathodoluminescence (infrared, visible, and/or ultraviolet photons). For example, one or more components of this auxiliary radiation can be detected and used for imaging. As an alternative to the use of electrons as an irradiating beam, charged particle microscopy can also be performed using other species of charged particle. In this respect, the phrase "charged particle" should be broadly interpreted as encompassing electrons, positive ions (e.g., Ga or Xe ions), negative ions, protons, and positrons, for instance. In addition to imaging and performing localized surface modification (e.g., milling, etching, deposition, etc.), a charged particle microscope can also have other functionalities, such as performing spectroscopy, examining diffractograms, etc.

In the disclosed embodiments, magnetic fields produced by magnetic dispersers (e.g., magnetic lenses that are provided for electron-beam based image formation, magnetic stubs, etc.) (or using other charged particle beams) are operated with reduced magnetic field strength typically produced with currents less than those used in image formation. As used herein, field strengths produced by magnetic dispersers depend on "disperser excitations," (for example, "lens excitations") and can be associated with, for example, dispersion currents or numbers of turns in dispenser coils. In the disclosed examples, a "zero" excitation is a disperser excitation (or range of disperser excitations) selected to reduce or eliminate magnetic fields at a region of interest on or near a specimen that result from, for example, remnant magnetization of pole pieces of one or more magnetic lenses, stray magnetic fields associated with ion or electron beam focusing or control, or other magnetic fields. In typical examples, the zero excitation is selected so that components of a multi-component ion beam having differing charge to mass ratios remain focused at or near a common location. An "imaging" excitation refers to a disperser excitations (or range of excitations) associated with imaging operation of the associated electron microscope, such as focusing of an electron beam on a target area in scanning electron microscopy (SEM) or shaping transmitted electrons to form an electron image (TEM). In many examples, such imaging excitations include a range of excitations that are selectable by an operator. An "analysis" excitation is a disperser excitation (or range of excitations) that is selected so that components of a multi-component ion beam having differing charge to mass ratios are dispersed at or near a specimen or other test surface so that such components are incident on the test surface at different locations that are functions of each component's respective charge to mass ratio. Specific values in a range of excitation values can be selected to produce an intended component distribution. In some cases, excitations are referred to as being associated with particular magneto-motive forces (MMFs), wherein a MMF is a product of a dispersion current and a number of turns in a disperser coil energized with the current. In some examples, beam components resulting from analysis mode operation of a magnetic disperser are referred to as identified if deflected to permit the presence of the beam component to be noted. In some cases, a charge to mass ratio, a charge, a mass, or both charge and mass associated with the beam components are determined. As used herein, such determinations are referred to providing beam component composition and/or beam component magnitudes.

As used herein, a "beam collector" is operable to receive an ion beam or components thereof and produce a corresponding signal, typically an electrical current that can be measured to determine an amplitude of a component beam. Representative examples include Faraday cups or other conductive shells, but other apertures or beam blocks using plate edges, or electrical ion detectors can be used.

In some examples, ion beam components are used to mill associated spots in a test substrate such as a silicon substrate. An image of the milled substrate and the milled spots can be processed to associate spots with ion charge to mass ratios. As used herein, "image" refers to a visual image as well as a digital or other stored representation of a visual image. In addition, the singular forms "a," "an," and "the" include the plural forms unless the context clearly dictates otherwise. Additionally, the term "includes" means "comprises." Further, the term "coupled" does not necessarily exclude the presence of intermediate elements between the coupled items.

The systems, apparatus, and methods described herein should not be construed as limiting in any way. Instead, the present disclosure is directed toward all novel and nonobvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art. In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

Example 1

Referring now to FIG. 1A, in a representative embodiment, a dual-beam system 100 comprises a scanning electron microscope (SEM) 102 and an ion beam column 104. The SEM 102 can comprise one or more charged particle beam (CPB) lenses such as a condenser lens 116 and an objective lens 106. In some embodiments, one or more CPB lenses can be magnetic lenses, and particularly the objective lens 106 can be a magnetic objective lens. The ion beam column is arranged to provide a focused ion beam (FIB) to a sample S, and the SEM 102 is situated for production of an image of the sample S. The SEM 102 and the ion beam column 104 can be mounted to a vacuum chamber 108 housing a movable substrate holder 110 for holding a sample S. The vacuum chamber 108 can be evacuated using vacuum pumps (not shown). The substrate holder 110 can be movable in the X-Y plane as shown with respect to a coordinate system 150, wherein a Y-axis is perpendicular to a plane of the drawing. The substrate holder can further move vertically (along a Z-axis) to compensate for variations in the height of the sample S.

In some embodiments, the SEM 102 can be arranged vertically above the sample S and can be used to image the sample S, and the ion beam column 104 can be arranged at an angle and can be used to machine and/or process the sample S. FIG. 1A shows an exemplary orientation of the SEM 102 and the ion beam column 104.

The SEM 102 can comprise an electron source 112 and can be configured to manipulate a "raw" radiation beam from the electron source 112 and perform upon it operations such as focusing, aberration mitigation, cropping (using an aperture), filtering, etc. The SEM 102 can produce a beam 114 of input charged particles (e.g., an electron beam) that propagates along a particle-optical axis 115. The SEM 102 can generally comprise one or more lenses (e.g., CPB lenses) such as the condenser lens 116 and the objective lens 106 to focus the beam 114 onto the sample S. In some embodiments, the SEM 102 can be provided with a deflection unit 118 that can be configured to steer the beam 115. For example, the beam 114 can be steered in a scanning motion (e.g., a raster or vector scan) across a sample being investigated.

As mentioned above, the objective lens 106 (e.g., an ultra-high resolution (UHR) lens) is a magnetic lens that can be configured to generate a magnetic field to detect and quantify components of an ion beam 124. The magnetic objective lens 106 can be energized to operate in a "zero" mode, an analysis mode, and an imaging mode, which are associated with progressively larger magnetic field magnitudes.

As described in further detail below, operation of the magnetic objective lens 106 in the analysis mode can create an analysis magnetic field near the sample that is strong enough to induce dispersion of ion beam components such as different atomic species and/or isotopes within the ion beam 124 generated by the ion beam column 104. In other words, the analysis magnetic field can split the ion beam 124 into one or more component beams. The component beams can include a primary ion beam comprising a selected ion (such as an ion intended for use in FIB milling or other operation), and one or more beams comprising non-primary ions or undesired isotopes (for example, ions associated with a previously selected ion that is not completely purged). When operating in the analysis mode, an analysis excitation is applied to the objective lens 106. In some particular embodiments, the analysis excitation corresponds to a magnetomotive force (MMF) between about 0 ampere-turns (At) and 500 At, and particularly between about 100 At and about 300 At. Operation of the magnetic objective lens 106 in the zero mode can be used to cancel remnant magnification caused by, for example, a lens pole piece, thereby creating a zero-field (or low field) condition for ion beam column milling. When operating in the zero mode, the objective lens 106 can be configured to operate with a relatively low excitation such as at MMFs between about −20 At and 20 At. When operating in the imaging mode, the objective lens 106 can be configured to generate an imaging magnetic field having an imaging excitation, typically having a magnitude that is at least 10 times greater than the magnitude of the analysis excitation. In some particular embodiments, the imaging excitation can be greater than or equal to about 1000 At.

The dual-beam system 100 can further comprise a computer processing apparatus and/or a control unit 128 for controlling inter alia the deflection unit 118, charged particle beam (CPB) lenses 106, 116, and detectors (not shown), and for displaying information gathered from the detectors on a display unit. The control unit 128 can also perform analysis on the ion beam 124, identifying the magnitude and species of the component ions based, for example, on ion beam component separations produced in the analysis mode. In some cases, a control computer 130 is provided to establish various excitations, record imaging data, and generally control operation of both the SEM and the FIB.

Referring still to FIG. 1A, the ion beam column 104 can comprise an ion source (e.g., a plasma source 120) and ion beam optics 122. In the illustrated embodiment, the ion beam column 104 is a plasma focused ion beam (PFIB), however, in other embodiments, the ion beam column 104 can be a standard focused ion beam (FIB) having a liquid metal ion source (LMIS), or any other ion source compatible with a focused ion beam column. The ion beam column 104 can produce and/or direct the ion beam 124 along an ion-optical axis 125. As mentioned above, the ion column 104 can be used to perform imaging, processing and/or machining operations on the substrate, such as incising, milling, etching, depositing, etc.

In embodiments wherein the ion beam is a PFIB, the ion source 120 can be fluidly coupled to a plurality of gases via a gas manifold 126 that includes gas sources 142A-142D coupled by respective valves 141A-141D to the ion source 120. A valve 140 is situated to selectively couple gases from the gas manifold 126 to the ion source 120. Exemplary gases include, but are not limited to, xenon, argon, oxygen, and nitrogen as shown in FIG. 1A. During operation of the ion source 120, a gas can be introduced, where it becomes charged or ionized, thereby forming a plasma. Ions extracted from the plasma can then be accelerated through the ion beam column 104, becoming an ion beam. However, the ion beam can comprise impurities. "Impurity" is used here to mean any non-primary and/or undesired ion species, and can include, for example, ions from a previously-used gas that remain after switching between gas species, or undesired isotopes of the primary ion species. In some cases, impurities can be purged between uses by running the ion beam column for a period of time, or re-pumping the gas supply lines, but it can be difficult to determine the amount of time needed to purge and to verify whether the beam is pure. Additionally, impurities such as undesired isotopes cannot generally be purged in this manner.

Operating the magnetic objective lens 106 in analysis mode can be used to determine whether there are any impurities in the ion beam 124, and to identify the species of impurity and the magnitude of impurities relative to the ion beam. As an ion beam 124 is directed at the sample S, the objective lens 106 can operate in the analysis mode, generating an analysis magnetic field that deflects ions in the ion beam away from their original trajectory, thereby splitting the ion beam 124 into one or more component beams. The control unit 128 can measure the deflections (magnitude of deflection and associated current) to identify the presence of non-primary (e.g., impure) ion species or isotopes other than the primary source (i.e., Ga for LMIS or the particular plasma being used for PFIB) and determine relative amounts of non-primary species or isotopes. Typically, beam deflection of a known ion (known charge to mass ratio) can be used to correlate beam deflections of other ions or isotopes. In some cases, a range of analysis excitations is applied to determine deflection as a function of excitation. The deflection of a primary beam (or other reference beam) can be calculated as follows:

$$x_0 = \frac{1}{2} \frac{q_0 v_0 B \sin\theta}{m_0} \left(\frac{z}{v_0}\right)^2 = \left(\frac{1}{2} B z^2 \sin\theta\right) \frac{q_0}{m_0 v_0} =$$

$$\beta \frac{q_0}{m_0 v_0} = \beta \frac{q_0}{m} \sqrt{\frac{m_0}{2 q_0 E_B}} = \beta \sqrt{\frac{q_0}{2 m_0 E_B}} = \alpha \sqrt{\frac{q_0}{m_0 E_B}};$$

wherein $x_o$ is beam deflection of the reference beam, $q_o$ is reference ion charge, $v_o$ is reference ion speed, B is a magnitude of a magnetic field produced by an analysis excitation, θ is an angle between ion velocity and a magnetic field direction, $m_o$ is a mass of the reference ion, z is a propagation distance of the reference ion, $β=(Bz^2 \sin\theta)/2$, $E_B$ is ion beam potential, and $α=β/\sqrt{2}$. The quantity β is assumed to be the same for all ions, due to the geometry of the system.

Assuming a constant B, z, and θ, the control unit 128 can use the measured deflection ratio of the impurities with respect to the primary beam to identify the mass-to-charge ratio of the unknown ion species according to the following equation:

$$\frac{m_n}{q_n} = \frac{m_0 E_B}{q_0 E_n} \left(\frac{x_0}{x_n}\right)^2$$

wherein $m_n$ is an ion mass of the unknown species, $q_n$ is a charge of the unknown ion species, $E_n$ is an ion beam potential of the unknown species (generally assumed to be the same as the reference, i.e., $E_n = E_B$, and $x_n$ is a beam deflection of the unknown species. Thus, measurement of $x_n$ permits determination of mass to charge ratio for additional ion species based on deflection of the reference species.

Figure 1B:
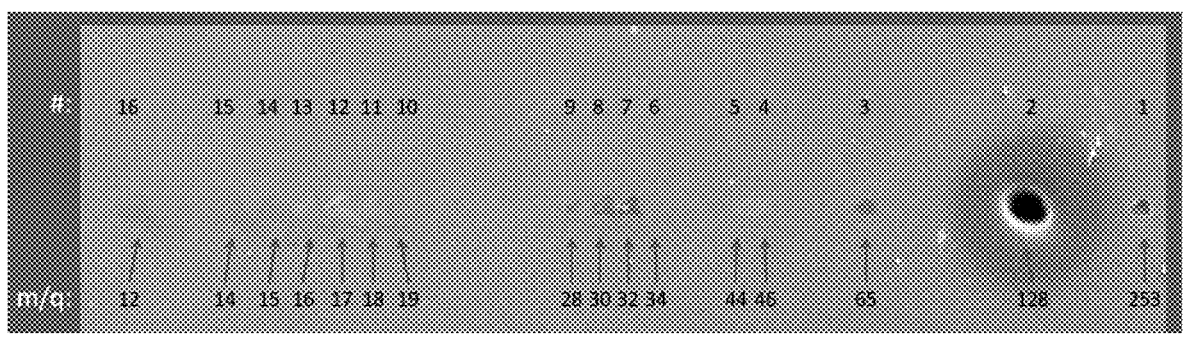
FIG. 1B illustrates a representative ion beam milling pattern for a primary xenon beam undergoing analysis.

Once a mass-to-charge ratio of an unknown species is determined, the species can be identified. FIG. 1B shows an exemplary analysis of an ion beam in which Xe is to be the primary component. The ion beam is directed to a test substrate and used to mill a plurality of spots in the test substrate. As shown, the analysis magnetic field splits the beam into 16 component beams. Mass-to-charge ratios (m/q) of each component were calculated, and compositions of selected components are shown in FIG. 1B. Additional components can be present, but with intensities that are too low for test substrate milling. Once the compositions (or presence) of the impurities has been determined for non-selected ion species, the control unit 128 can determine a time required to effectively purge unwanted constituents so that the ion beam 124 consists primarily of the selected ion species. For example, the current of both the main ion beam and the impurity beam can be measured and compared. The system can then be run (purged) until the current of the impurity beam is below a selected threshold, or until the spot milled by the impurity beam is no longer visible. Alternatively, the amount of time needed to purge a specific contaminant could be calculated mathematically. For undesired isotopes, the control unit 128 can select the primary beam using, for example, a selection shield, as described in more detail below.

Example 2

Figure 1C:
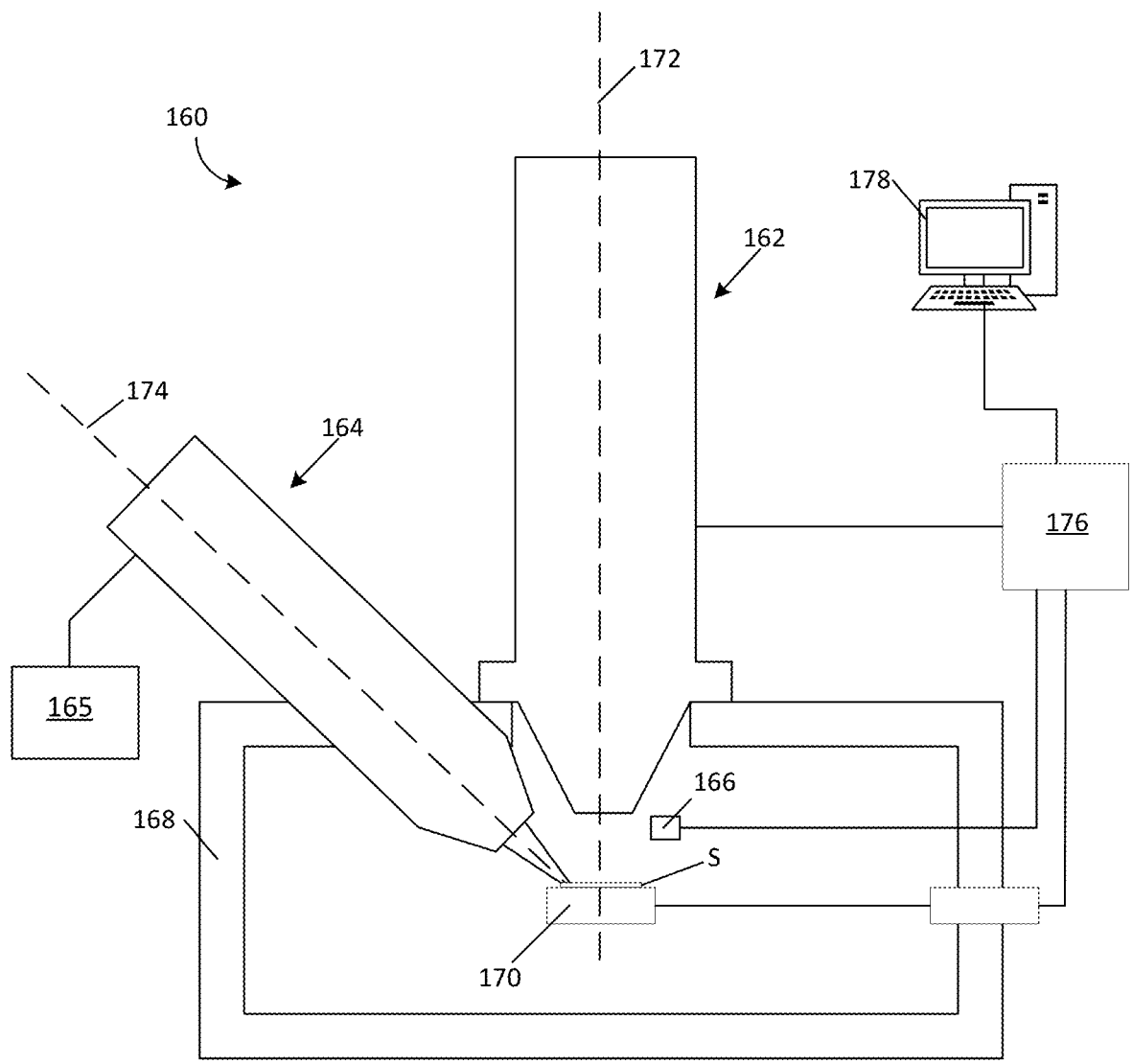
FIG. 1C illustrates a representative dual-beam system for performing ion beam analysis including a magnetic disperser.

Referring to FIG. 1C, in a representative embodiment, a dual-beam system 160 comprises a scanning electron microscope (SEM) 162, an ion beam column 164 coupled to a gas manifold 165, and a magnetic disperser (e.g., magnetic stub 166). The ion beam column 164 is arranged to provide a focused ion beam FIB to a sample S, and the SEM 162 is situated for production of an image of the sample S. The SEM 162 and the ion beam column 164 can be mounted to a vacuum chamber 168 housing a movable substrate holder 170 for holding sample S. The vacuum chamber 168 can be evacuated using vacuum pumps (not shown). The SEM 162 can produce a beam of input charged particles (e.g., an electron beam) that propagates along a particle-optical axis 172. The ion beam column 164 can produce and direct an ion beam along an ion-optical axis 174 to perform imaging, processing and/or machining operations on the substrate, such as incising, etching, depositing, etc.

As mentioned above, the dual-beam system can comprise a magnetic disperser configured to generate a magnetic field to detect and quantify components of an ion beam. In the illustrated embodiment, the magnetic disperser is a magnetic stub 166. In other embodiments, the magnetic disperser can be, for example, a portion of a lens (e.g., magnetic objective lens 106 of FIG. 1A). The magnetic stub 166 can be energized to operate in a "zero mode" and one or more analysis modes, which are typically associated with progressively larger magnetic field magnitudes.

Operation of the magnetic stub 166 in an analysis mode can create an analysis magnetic field near the sample that is strong enough to induce dispersion of ion beam components such as different atomic species, isotopes, or ionizations within the ion beam generated by the ion beam column 164. In other words, the analysis magnetic field can split the ion beam into one or more component beams. The component beams can include a primary ion beam comprising a selected ion (such as an ion intended for use in FIB milling or other operation), and one or more beams comprising non-primary ions or undesired isotopes (for example, ions associated with a previously selected ion that is not completely purged). When operating in the analysis mode, an analysis excitation is applied to the magnetic stub 166. In some particular embodiments, the analysis excitation corresponds to a magnetomotive force (MMF) between about 0 ampere-turns (At) and 500 At, and particularly between about 100 At and about 300 At. Operation of the magnetic stub 166 in the zero mode can be used to cancel remnant magnification caused by, for example, a lens pole piece, thereby creating a zero-field (or low field) condition for ion beam column milling. When operating in the zero mode, the magnetic stub 166 can be configured to operate with a relatively low excitation such as at MMFs between about −2 At and 20 At.

The dual-beam system can further comprise a computer processing apparatus and/or a control unit 176 for controlling the positioning and excitation of the magnetic stub 166. The control unit can also control the SEM 102 and the ion beam column 104. The control unit 176 can perform analysis on the ion beam, identifying the magnitude and species of the component ions based, for example, on ion beam component separations produced in the analysis mode. In some cases, a control computer 178 is provided to establish various excitations, record data, and generally control operation of the SEM, the FIB, and the magnetic stub.

The magnetic stub 166 can be operated in analysis mode to determine whether there are any impurities in the ion beam, and to identify the species of impurity and the magnitude of impurities relative to the ion beam. As an ion beam is directed at the sample S, the magnetic stub 166 can operate in the analysis mode, generating an analysis magnetic field that deflects ions in the ion beam away from their original trajectory, thereby splitting the ion beam into one or more component beams. The control unit 176 can measure the deflections (magnitude of deflection and associated current) to identify the presence of non-primary (e.g., impure) ion species or isotopes other than the primary source (i.e., Ga for LMIS or the particular plasma being used for PFIB) and determine relative amounts of non-primary species or isotopes. Typically, beam deflection of a known ion (known charge to mass ratio) can be used to correlate beam deflections of other ions or isotopes. In some cases, a range of analysis excitations is applied to determine deflection as a function of excitation. The deflection of a primary beam (or other reference beam) can be calculated as follows:

$$x_0 = \frac{1}{2} \frac{q_0 v_0 B \sin\theta}{m_0} \left(\frac{z}{v_0}\right)^2 = \left(\frac{1}{2} B z^2 \sin\theta\right) \frac{q_0}{m_0 v_0} =$$

$$\beta \frac{q_0}{m_0 v_0} = \beta \frac{q_0}{m} \sqrt{\frac{m_0}{2q_0 E_B}} = \beta \sqrt{\frac{q_0}{2m_0 E_B}} = \alpha \sqrt{\frac{q_0}{m_0 E_B}} \ ;$$

wherein $x_o$ is beam deflection of the reference beam, $q_o$ is reference ion charge, $v_o$ is reference ion speed, B is a magnitude of a magnetic field produced by an analysis excitation, $\theta$ is an angle between ion velocity and a magnetic field direction, $m_o$ is a mass of the reference ion, z is a propagation distance of the reference ion, $\beta=(Bz^2 \sin\theta)/2$, $E_B$ is ion beam potential, and $\alpha=\beta/\sqrt{2}$. The quantity $\beta$ is assumed to be the same for all ions, due to the geometry of the system.

Assuming a constant B, z, and $\theta$, the control unit 176 can use the measured deflection ratio of the impurities with respect to the primary beam to identify the mass-to-charge ratio of the unknown ion species according to the following equation:

$$\frac{m_n}{q_n} = \frac{m_0 E_B}{q_0 E_n} \left(\frac{x_0}{x_n}\right)^2$$

wherein $m_o$ is an ion mass of the unknown species, $q_n$ is a charge of the unknown ion species, $E_n$ is an ion beam potential of the unknown species (generally assumed to be the same as the reference, i.e., $E_n=E_B$) and $x_n$ is a beam deflection of the unknown species. Thus, measurement of $x_n$ permits determination of mass to charge ratio for additional ion species based on deflection of the reference species.

The magnetic stub 166 of the present embodiment can be used in lieu of or in combination with the magnetic objective lens of the preceding embodiment. The magnetic stub 166 can also be used in combination with any of the following embodiments.

Example 3

Figure 2:
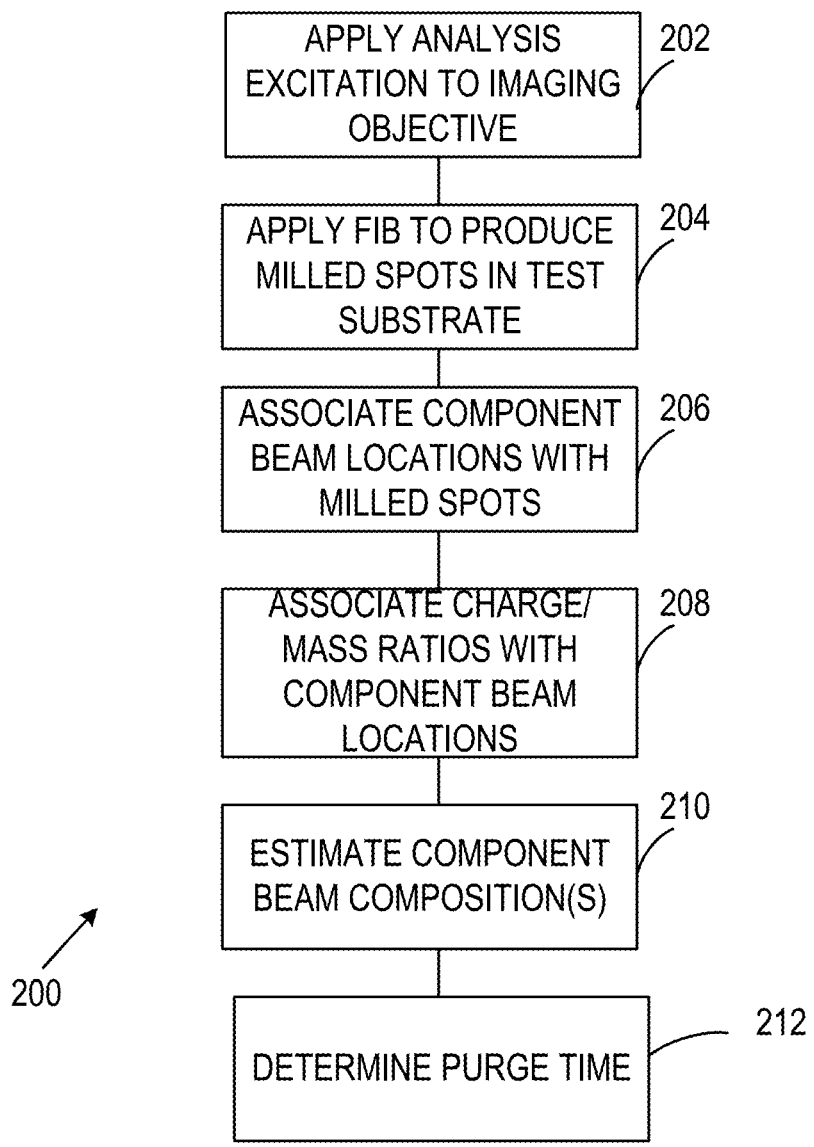
FIG. 2 illustrates a representative method of identifying ion beam components.

Referring to FIG. 2, a representative method 200 of identifying multiple ion components in an ion beam comprises applying an analysis excitation to an imaging objective at 202. At 204, an FIB being evaluated is used to mill spots in a test substrate in the presence of the analysis excitation. At 206, some or all of the milled spots are associated with component beam locations and at 208, some or all of the component beam locations are associated with beam compositions or charge to mass ratios. At 210, ion beam magnitude can be estimated based on beam currents associated with each charge to mass ratio. In some examples, at 212, vacuum purge time can be estimated so that beam intensity associated with unwanted ions is reduced.

Example 4

Figure 3A:
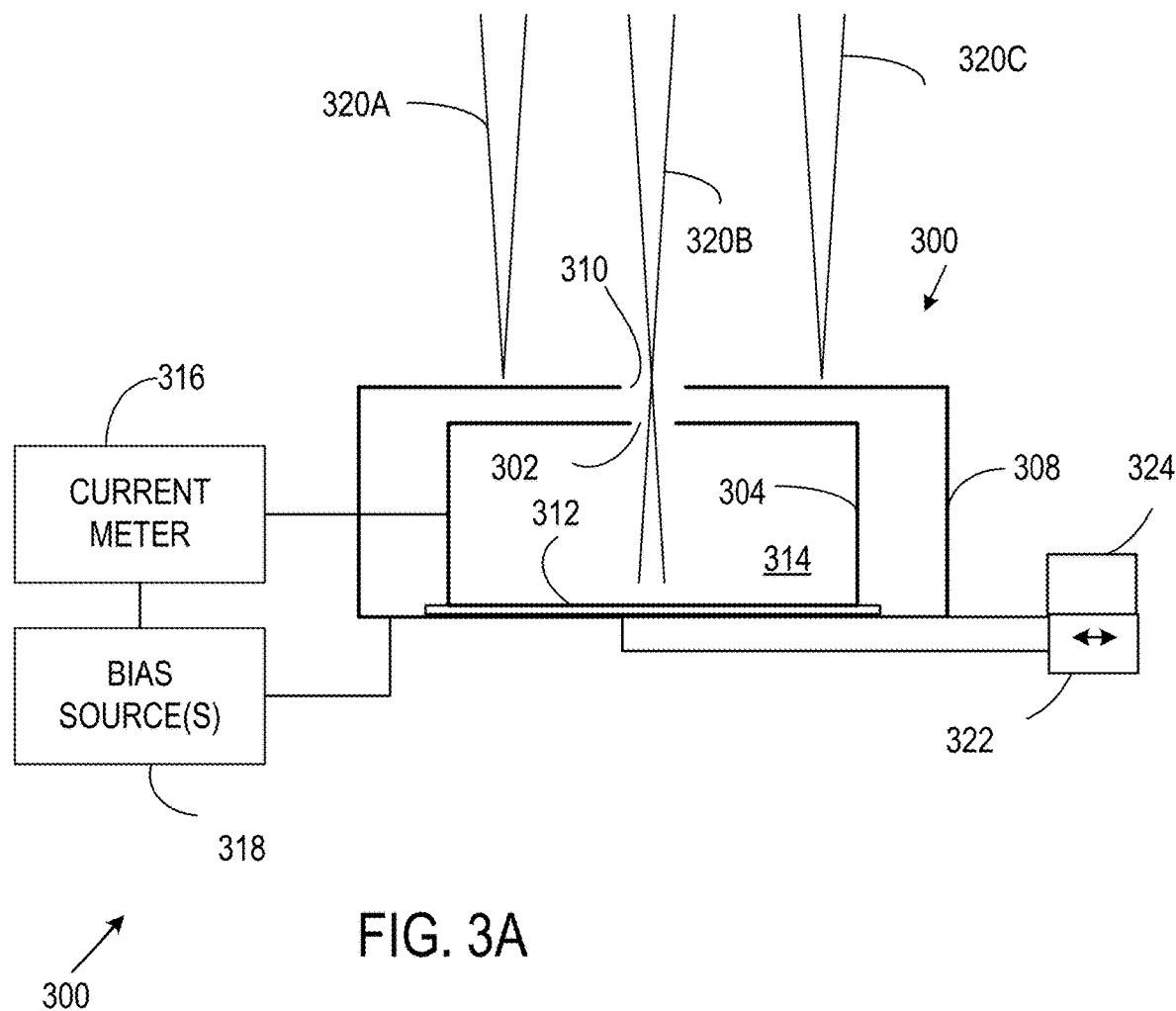
FIG. 3A illustrates a representative beam collector for quantifying magnitudes of one or more ion beam components.

In some embodiments, as shown in FIG. 3A, a movable beam capture assembly 300 can be configured to identify and/or quantify the magnitude of components within an ion beam. In the example of FIG. 3A, the movable beam capture assembly 300 includes an aperture 302 defined in an inner conductive shell 304 that can be sized to pass one or more FIB components. As shown in FIG. 3A, the inner conductive shell is electrically insulated from an outer conductive shell 308 that defines an aperture 310 that can also be sized to transmit a single FIB component. An insulating layer 312 electrically separates the inner conductive shell 304 and the outer conductive shell 308. The inner and outer conductive shells 304, 308 can each be secured to the insulating layer 312. The apertures 302, 310 are generally aligned to allow beams to be transmitted into a volume 314 defined by the inner conductive shell 304. A current meter 316 and a bias source 318 are typically electrically coupled to the inner conductive shell 308, and, if desired, one or both of the current meter 316 and the bias source 318 (or additional current meters and/or bias sources). The movable beam capture assembly 300 is secured to an actuator 322 so as to be translatable with respect to incident ion beams or beam components. Motion of the actuator 322 can be quantified with an encoder 324 that is secured to the actuator 322. In other examples, translation of the movable beam capture assembly is measured with an encoder coupled to report translation of the aperture 302 across an incident FIB component. If desired, a controller such as a dedicated or general purpose processor can be coupled to the actuator 322, the encoder 324 and the current meter 316 to obtain current values at a plurality of aperture positions to characterize an ion beam.

As shown in FIG. 3A, with an analysis excitation applied to a magnetic objective lens to produce component beams from an ion beam, representative component beams 320A-320C are produced. The beam 320B is shown situated to be transmitted by the aperture 302. Translating the aperture 302 permits currents and translations for each of the beam components 320A-320C to be measured. Positioning the aperture 302 corresponds to selecting a particular charge to mass ratio for analysis of ion beam components. In some examples, a total contribution of unwanted components to beam current is sufficient, while in other examples, currents at some or all charge to mass ratios are of interest and are obtained.

Example 5

Figure 3B:
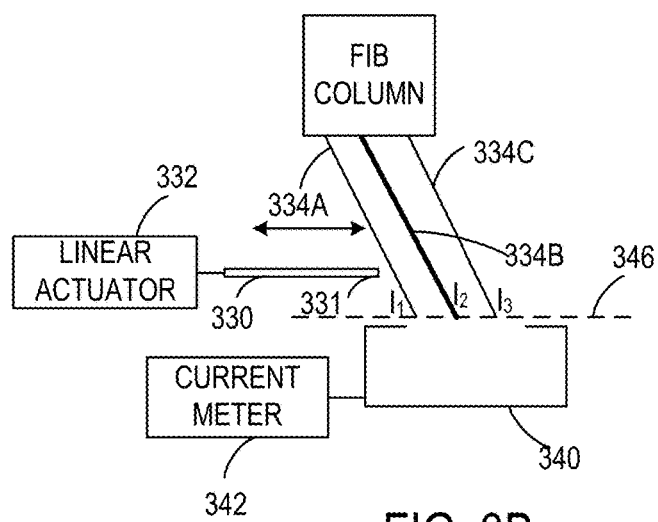
FIG. 3B illustrates a representative beam block that is insertable into an ion beam for quantifying magnitudes of one or more ion beam components.
Figure 3C:
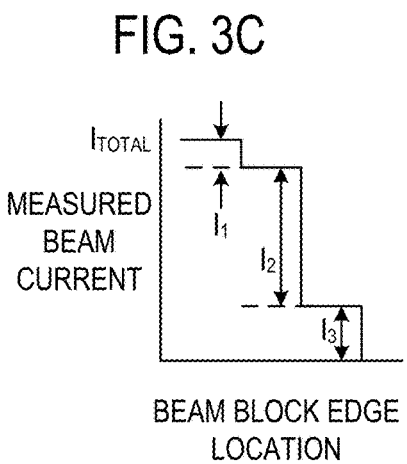
FIG. 3C is a graph of measured beam current as a function of beam position for the beam block system of FIG. 3B.

Inner and outer conductive shells are not required to separate beam components. A single conductive shell or a single aperture can suffice. Referring to FIG. 3B, a beam block plate 330 having an edge 331 is coupled to a linear actuator 332 to be movable so as to selectively block or transmit representative beam components 334A-334C from reaching a conductive shell 340. A current meter 342 is coupled to the conductive shell 340 and provides a measurement of beam component current. Typically, the beam block plate 330 is situated at or near a beam focal plane 346. FIG. 3C is a representative graph of measured beam current as a function of beam block edge location associated with the arrangement of FIG. 3B. As shown, a total beam current is reduced as the beam block edge occludes portions of an input ion beam, and between component beam focused spots, beam current remains nearly constant. In other words, as the beam block edge advances, beam component 334A is blocked resulting in a drop in the measured beam current corresponding to the current of beam component 334A, represented by I1. As the beam block edge continues to advance, beam components 334A and 334B are blocked, resulting in a further drop in the measured beam current corresponding to the current of beam component 334B, represented by I2. Eventually all three beams are blocked, resulting in a drop in the measured beam current corresponding to the current of beam component 334C With FIG. 3C, beam current and associated charge to mass ratios can be estimated.

In other examples, an aperture plate is used, and can be sized to transmit one or more component beams, or a portion thereof. In addition, in some cases, an FIB can be defocused to be larger than a fixed aperture.

Example 6

Figure 3D:
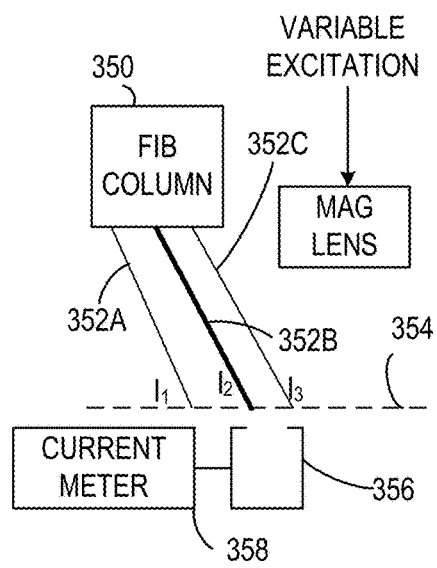
FIG. 3D illustrates a representative system for varying an analysis excitation for quantifying magnitudes of one or more ion beam components using a fixed beam collector.
Figure 3E:
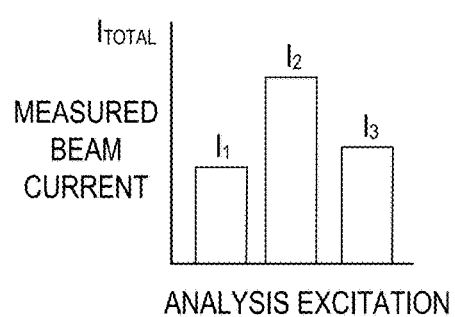
FIG. 3E is a graph of measured beam current as a function of analysis excitation for the system of FIG. 3D.

In other examples, an analysis excitation is varied and a current collector such as a Faraday cup is fixed. Referring to FIG. 3D, an FIB column 350 directs representative FIB beam components 352A-352C to a test surface (typical a working surface location) 354. The FIB beam components 352A-352C are each received by a Faraday cup 356 in turn, and the beam current of each beam component is measured with a current meter 358. An analysis excitation applied to the magnetic lens is varied, and collected beam current is measured with the current meter 358. Representative beam current as a function of excitation is illustrated in FIG. 3E for a FIB have components with three different charge to mass ratios. The current of beam component 352A is represented by $I_1$, the current of beam component 352B is represented by $I_2$, and the current of beam component 352C is represented by $I_3$. As the applied excitation is increased, additional beam components are deflected so that the measured current decreases. Excitation can be varied as an increasing or decreasing linear or nonlinear ramp, one or more excitation steps which can each be associated with one or more charge to mass ratios. In the arrangement of FIG. 3D, a fixed Faraday cup can be used.

Example 7

Figure 4:
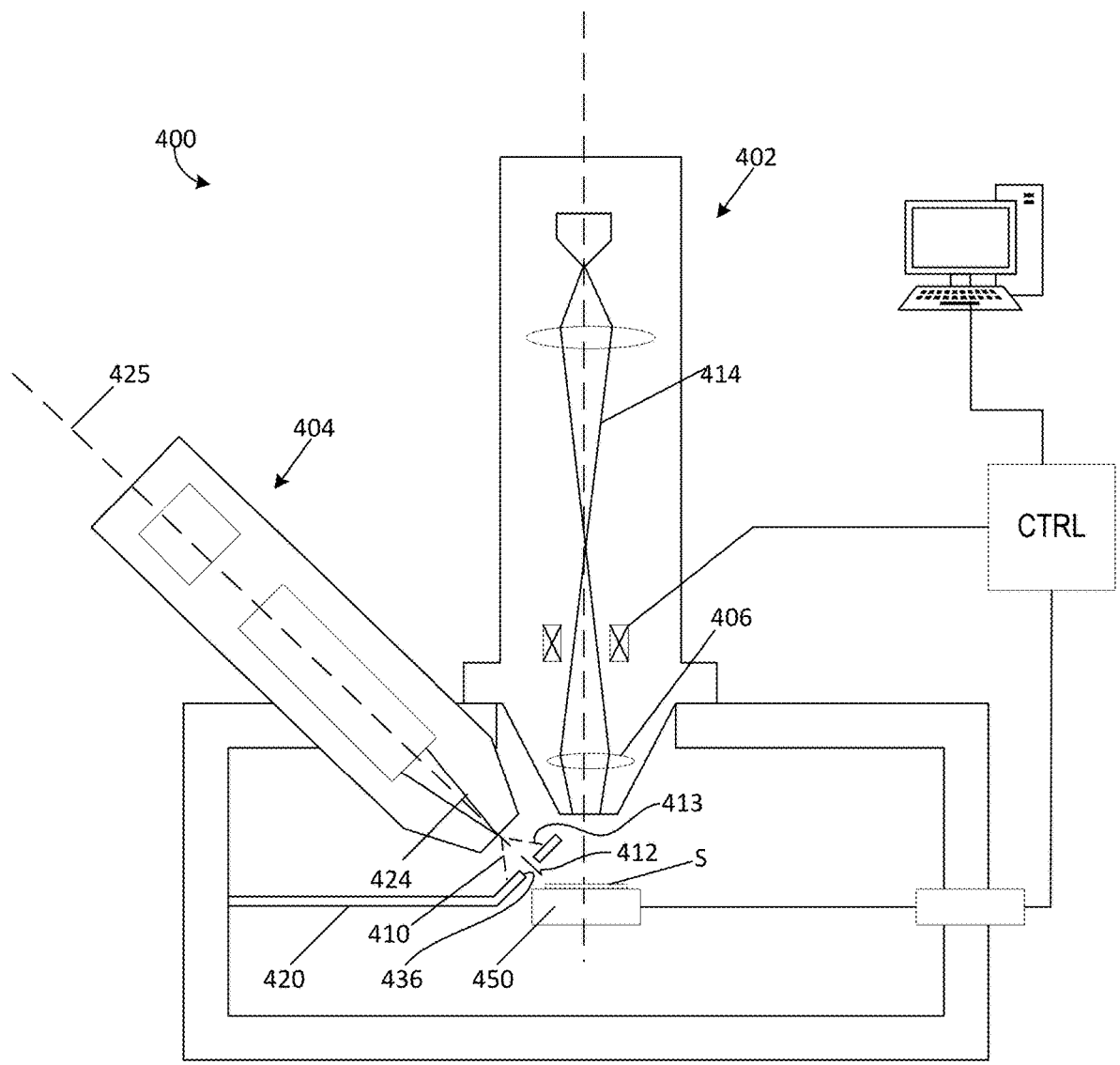
FIG. 4 illustrates a representative dual-beam system that includes a selection shield for performing ion beam analysis.

Referring to FIG. 4, in some embodiments, a dual-beam system 400 similar to that shown in FIG. 1A includes an imaging column 402 (typically associated with an electron microscope) and an ion beam column 404 that is configured to direct an ion beam along an axis 425. An analysis excitation can be applied to an objective lens 406 of the imaging column 402 to produce a magnetic field that deflects representative components 411, 412, 413 of an ion beam 424. A selection shield 420 is configured to be movable in an X-Y plane and comprises at least one aperture 436. The aperture 436 of the selection shield 420 can be aligned with a selected component beam, for example, component beam 412 thereby allowing only the selected component beam 412 to pass through the aperture 436. A substrate holder 450 can be used to move a substrate S in the X- and Y-directions, thereby allowing the selected component beam to mill the surface of the substrate S. Other positions of the selection shield permit selection of one or more of the component beams 411, 413 to be used in processing the substrate S.

Typically, the object lens 406 is used to generate a magnetic field for use in ion beam analysis, but in some alternative embodiments, in lieu of or in addition to the objective lens 406, a magnetic field generator (not shown) can be configured to generate an analysis magnetic field.

Example 8

In some examples, an analysis excitation applied to a magnetic objective lens is used to deflect the ion beam into one or more component beams. Locations of one or more of the deflected component beams are measured, and associated charge to mass ratios are determined Currents of one or more deflected component beams can also be measured and used to determine a magnitude of the component beam relative to an selected or preferred ion beam component.

In a particular exemplary method, an objective magnetic lens can be activated in the zero mode. While the lens operates in the zero mode, an ion beam can be used to mill a 'zero-spot' in the surface of a substrate S. The magnetic objective lens can then be activated in the analysis mode, thereby deflecting the ion beam into one or more component beams. The deflected ion beams can mill additional spots in the surface of the substrate S. The control unit can use the location of the additional spots to determine the species that make up the one or more component beams.

In some embodiments, the method can further comprise determining the current of one of the one or more component ion beams using, for example, an adjustable blocking plate, such as blocking plate 200 as described above. The selected component ion beam can be directed through the aperture of the blocking plate such that it is received within the Faraday cup. The current meter operatively coupled to the Faraday cup can then determine the current of the beam, thereby allowing the control unit 128 to determine a magnitude of the component ion beam relative to the ion beam 124.

Once the identities and magnitudes of the one or more impurities have been determined, a selection shield, such as selection shield described above, can be used to select a desired beam with which to mill the substrate.

Example 9

In some particular embodiments, a dual-beam system can be used to determine the purity of an ion beam generated from a liquid metal ion source (LMIS), such as gallium. Naturally occurring gallium is dual isotopic, meaning that it is a mixture of two isotopes: one isotope, which comprises about 60% of the atoms in naturally occurring gallium, has an atomic mass of about 69, and a second isotope, which comprises about 40% of the atoms in naturally occurring gallium, has an atomic mass of about 71. An analysis magnetic field created by a magnetic objective lens causes each isotope to be deflected differently, creating two beams. Beam currents and displacements can be measure to determine which of the beams corresponds to which isotope and quantify the relative amounts of each isotope present in the ion beam. If one of these isotopes is preferred for substrate processing, a selection shield or other aperture can be situated to permit only a preferred isotope to reach the substrate.

Example 10

Figure 5:
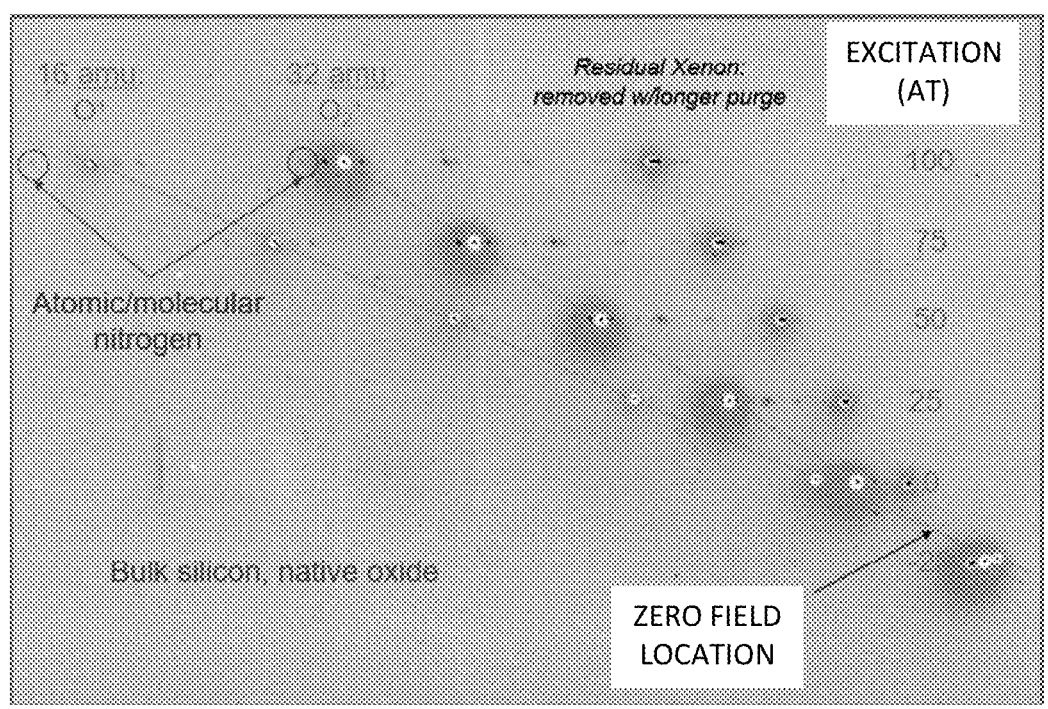
FIG. 5 illustrates a representative ion beam milling pattern for a primary oxygen beam undergoing analysis at various analysis excitations.

A dual-beam system as described above was used to quantitatively and qualitatively determine trace impurities of an oxygen ($O_2$) plasma beam. As shown in FIG. 5, a series of spots was milled into the substrate. First a 'zero spot' was milled during operation of an ultra-high resolution (UHR) lens in a zero mode with an excitation of about −20 At. The UHR lens was then operated in analysis mode, and additional spots were milled while moving the substrate in a Y-direction and increasing the analysis excitation between milling of each series of spots mill spot. As shown in FIG. 5, when the UHR lens is operated in analysis mode, the magnetic field causes differing deflections of the beam components resulting in a series of component spots. Deflections were measured at various UHR lens analysis excitations such as at approximately 25 At, approximately 50 At, and approximately 100 At, as well as at various beam energies, such as approximately 30 kV and approximately 8 kV.

Figure 6:
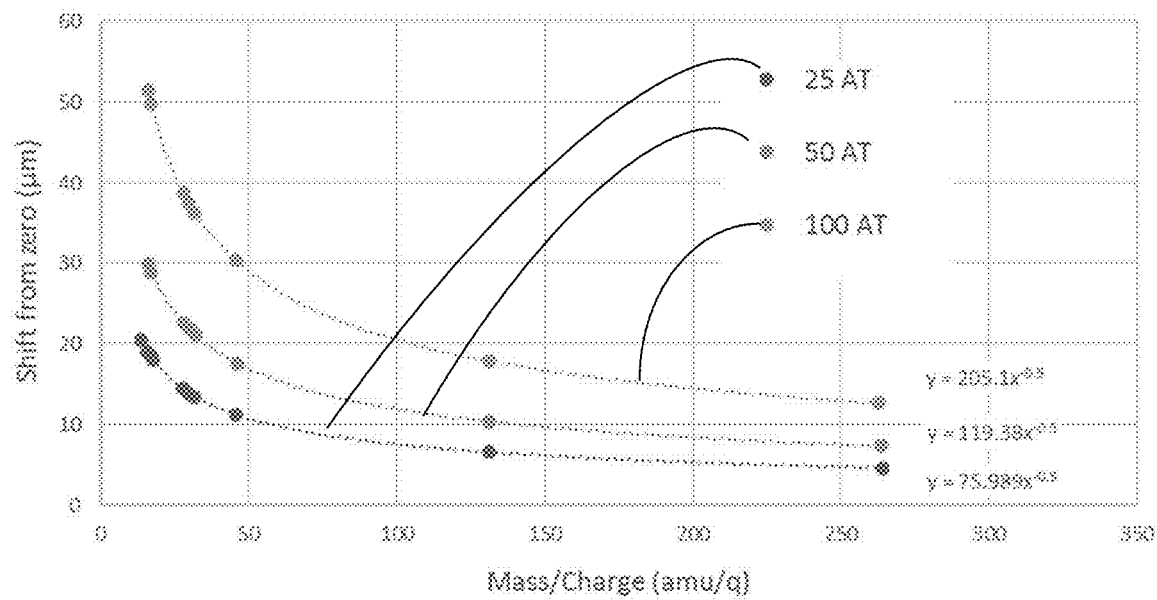
FIG. 6 is a graph of experimental results for a physical shift away from a zero point versus a mass/charge ratio of an ion resulting from a test of the dual-beam system.

Qualitative analysis was performed for the component spots of each series of milled spot. FIG. 6 illustrates the shift in ion position relative to a zero-spot position depending on the mass/charge of the ion for each of several analysis excitation values at a beam energy of 30 kV. By analyzing the field-dependent coefficients, the following equation for deflection was determined:

$$(1.7*AT+34)*(m/q)^{-0.5}$$

wherein AT is the analysis excitation applied by the UHR lens (in At), m is ion species mass, and q is ion species charge.

Figure 7:
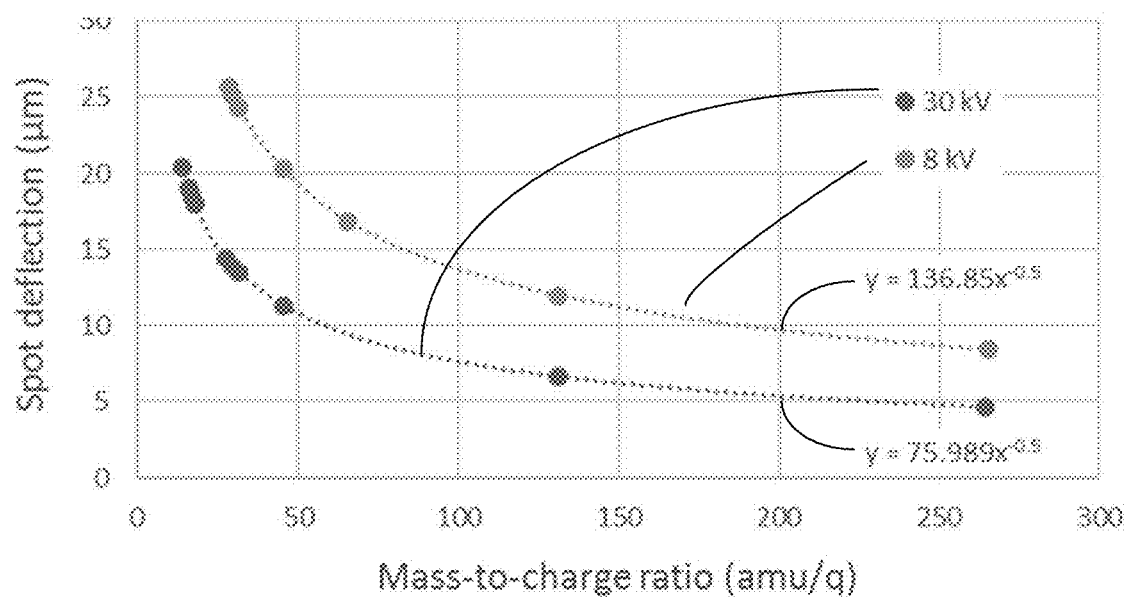
FIG. 7 is a graph of experimental results for deflection of a milled spot versus a mass/charge ratio of an ion at two ion beam energies at a first analysis excitation.
Figure 8:
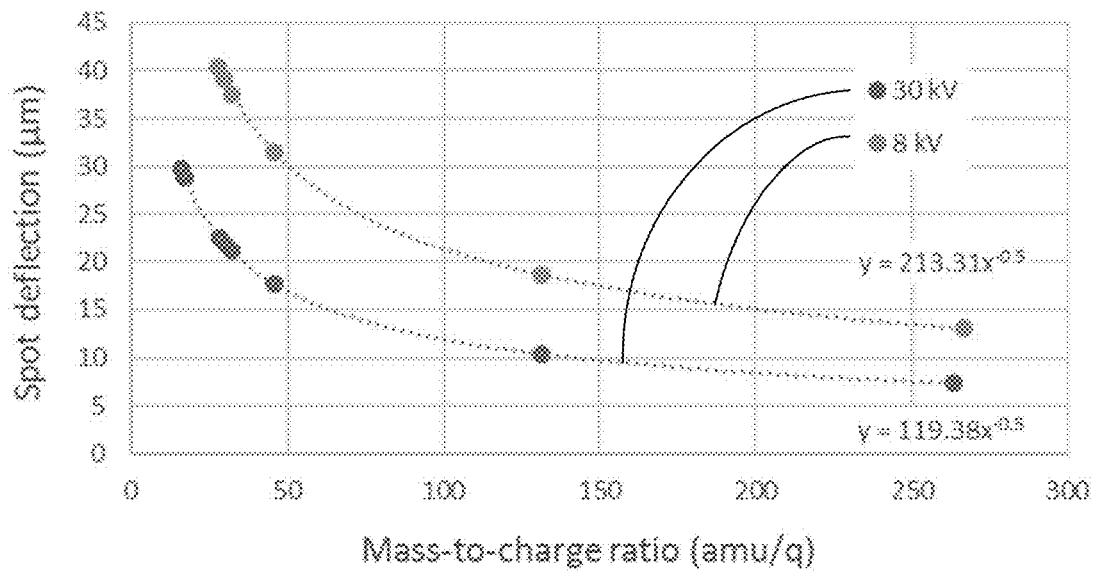
FIG. 8 is a graph of experimental results for deflection of a milled spot versus a mass/charge ratio of an ion at two ion beam energies at a second analysis excitation.

FIGS. 7-8 shown deflections at different analysis excitations (25 At and 50 At for 8 kV and 30 kV beam energies. As shown in FIGS. 7-8, greater deflections were observed for lower beam energies, and the following equation for deflection at 8 kV was determined:

$$(3.1*AT+60)*(m/g)^{-0.5}.$$

Figure 9:
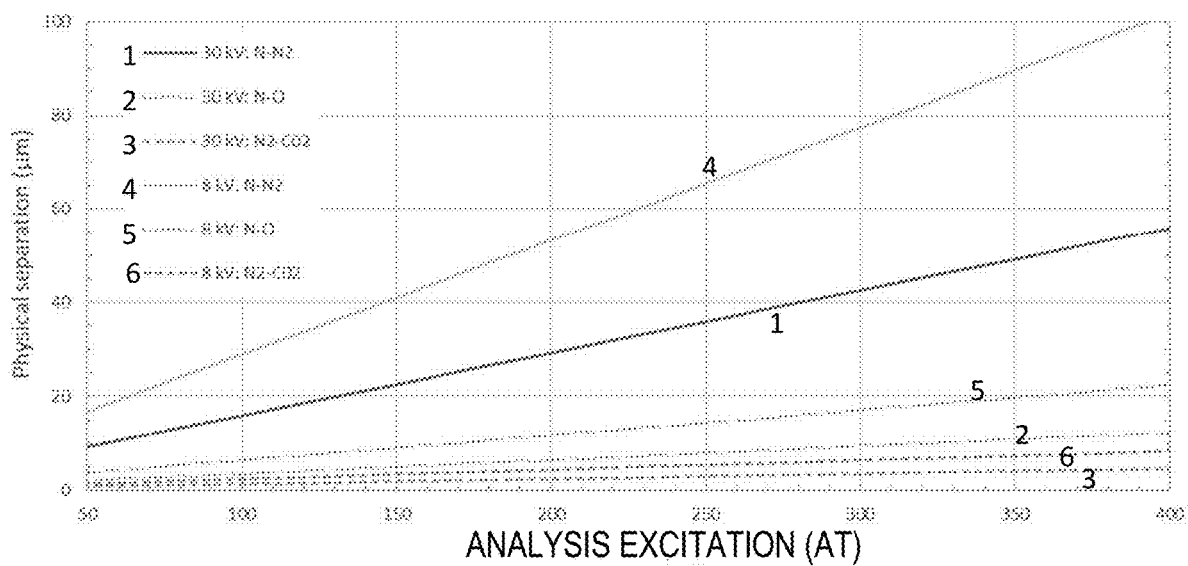
FIG. 9 is a graph of the measured separation versus analysis excitation between primary nitrogen beams and various impurities.

FIG. 9 is a graph showing separations between component beams of an ion beam have nitrogen as a primary or selected beam as a function of applied excitation. As shown in FIG. 9, as the analysis excitation increases, separations between ion beam components increase.

Example 11

In some examples, shapes and outlines of each milled spot in a series of milled spots can vary. In some cases, milled spots exhibit appreciable coma which can be reduced by quadrupole adjustment (with stage moves in y in between each spot). By looking at shape and outline, it's possible to see where the best quad value would be to reduce or minimizes coma asymmetry.

Example 12

Figure 10:
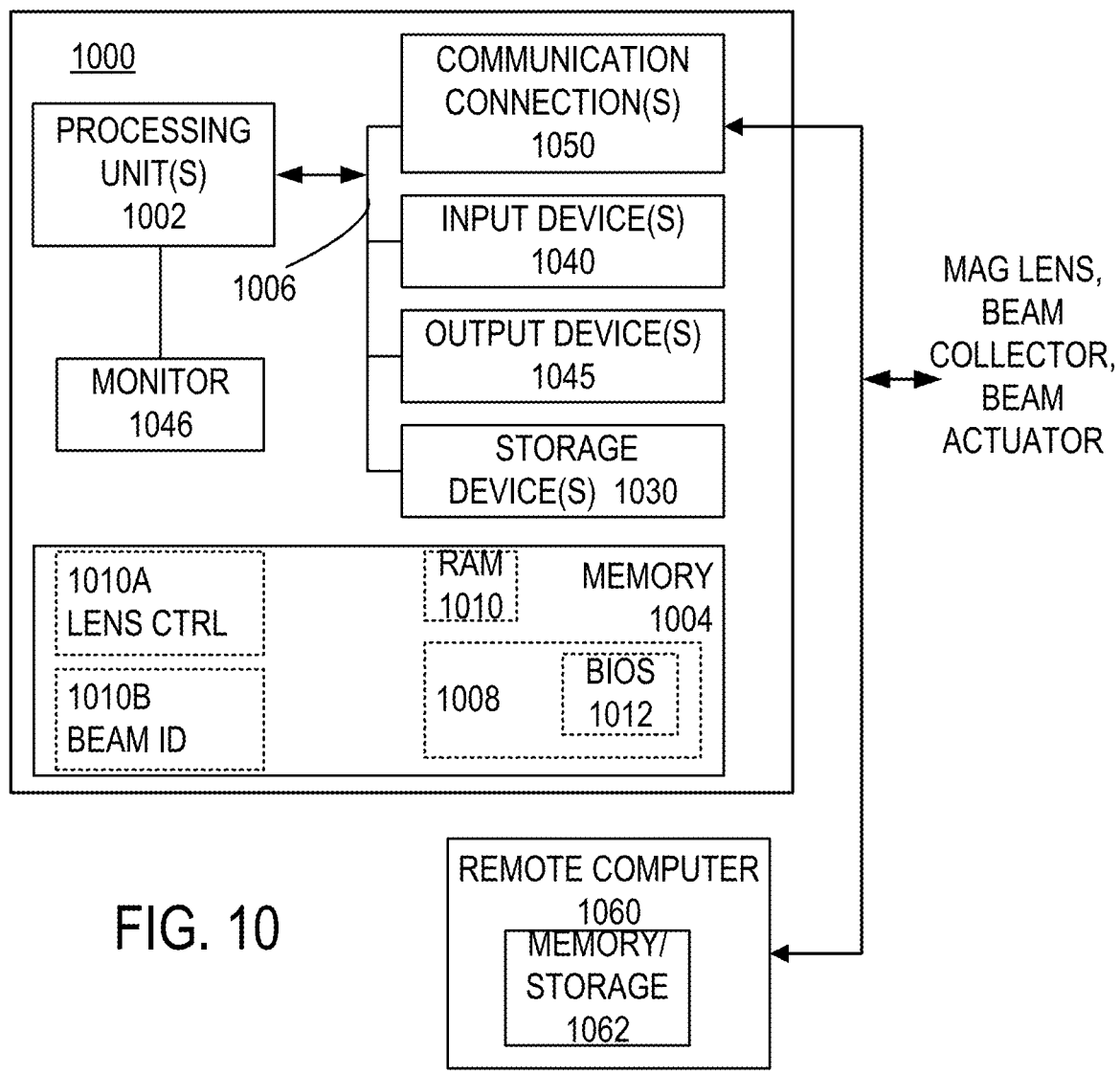
FIG. 10 illustrates a representative computer control system for use in implementing the disclosed methods and apparatus.

FIG. 10 and the following discussion are intended to provide a brief, general description of an exemplary computing environment in which the disclosed technology may be implemented. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network.

With reference to FIG. 10, an exemplary system for implementing the disclosed technology includes a general purpose computing device in the form of an exemplary conventional PC 1000, including one or more processing units 1002, a system memory 1004, and a system bus 1006 that couples various system components including the system memory 1004 to the one or more processing units 1002. The system bus 1006 may be any of several types of bus structures including a memory bus or memory controller, a peripheral bus, and a local bus using any of a variety of bus architectures. The exemplary system memory 1004 includes read only memory (ROM) 1008 and random access memory (RAM) 1010. A basic input/output system (BIOS) 1012, containing the basic routines that help with the transfer of information between elements within the PC 1000, is stored in ROM 1008. In the example of FIG. 10, data and processor-executable instructions for controlling analysis, imaging, and other operational modes of an SEM and an FIB are stored in a memory 1010A, and data and processor-executable instructions for identifying and quantifying beam components are stored in memory 1010B.

The exemplary PC 1000 further includes one or more storage devices 1030 such as a hard disk drive for reading from and writing to a hard disk, a magnetic disk drive for reading from or writing to a removable magnetic disk, and an optical disk drive. Such storage devices can be connected to the system bus 1006 by a hard disk drive interface, a magnetic disk drive interface, and an optical drive interface, respectively. The drives and their associated computer readable media provide nonvolatile storage of computer-readable instructions, data structures, program modules, and other data for the PC 1000. Other types of computer-readable media which can store data that is accessible by a PC, such as magnetic cassettes, flash memory cards, digital video disks.

A number of program modules may be stored in the storage devices 1030 including an operating system, one or more application programs, other program modules, and program data. A user may enter commands and information into the PC 1000 through one or more input devices 1040 such as a keyboard and a pointing device such as a mouse. A monitor 1046 or other type of display device is also connected to the system bus 1006 via an interface, such as a video adapter.

The PC 1000 may operate in a networked environment using logical connections to one or more remote computers, such as a remote computer 1060. In some examples, one or more network or communication connections 1050 are included. The remote computer 1060 may be another PC, a server, a router, a network PC, or a peer device or other common network node, and typically includes many or all of the elements described above relative to the PC 1000, although only a memory storage device 1062 has been illustrated in FIG. 10. The personal computer 1000 and/or the remote computer 1060 can be connected to a logical a local area network (LAN) and a wide area network (WAN).

Having described and illustrated the principles of the disclosure with reference to the illustrated embodiments, it will be recognized that the illustrated embodiments can be modified in arrangement and detail without departing from such principles. For instance, elements of the illustrated embodiment shown in software may be implemented in hardware and vice-versa. Also, the technologies from any example can be combined with the technologies described in any one or more of the other examples. It should be recognized that the illustrated embodiments are examples and should not be taken as a limitation on the scope of the disclosure. We therefore claim all subject matter that comes within the scope and spirit of the appended claims. Alternatives specifically addressed in the above examples are merely illustrative and do not constitute all possible alternatives to the embodiments described herein.

We claim:

1. A system, comprising:
   a magnetic disperser configured to operate in an analysis mode;
   an ion beam column configured to direct an ion beam to a substrate,
   wherein in the analysis mode the magnetic disperser is energized to deflect the ion beam into one or more component beams; and
   wherein the magnetic disperser is a charged particle beam (CPB) magnetic lens coupled to a lens driver, wherein the CPB magnetic lens is further configured to operate in an imaging mode, wherein in the imaging mode the CPB magnetic lens is associated with imaging of the substrate, and wherein the CPB is an electron beam.

2. The system of claim 1, wherein in the analysis mode, the lens driver is configured to apply an analysis excitation and in the imaging mode, the lens driver is configured to apply an imaging excitation that is greater than the analysis excitation.

3. The system of claim 2, wherein the imaging excitation has a magnitude that is at least 10 times a magnitude of the analysis excitation.

4. The system of claim 1, further comprising an ion beam collector situated to selectively receive individual component beams of the ion beam in response to an analysis excitation, and further comprising an actuator coupled to the ion beam collector and configured to move the ion beam collector to receive individual component beams of the ion beam in response to the analysis excitation.

5. The system of claim 4, wherein the ion beam collector is a Faraday cup.

6. The system of claim 4, wherein the lens driver is operable to provide a plurality of analysis excitations.

7. The system of claim 6, wherein the lens driver is operable to selectively direct one or more components of the ion beam to the ion beam detector and wherein the ion detector includes an aperture plate defining an aperture that is transmissive to the selectively directed one or more ion beam components.

8. The system of claim 1, further comprising a controller coupled to the lens driver to select either the analysis excitation or the imaging excitation for application to the CPB magnetic lens, the system controller being configured to estimate beam current associated with at least one of the ion beam components.

9. The system of claim 8, further comprising an ion beam detector and an actuator, wherein the controller is coupled to the ion beam detector and the actuator, and based on at least one current in the ion beam detector, determine compositions of components of the ion beam.

10. The system of claim 8, wherein the controller is configured to selectively operate the CPB magnetic lens in the imaging mode and the analysis mode, and scan a movable aperture in the analysis mode.

11. The system of claim 1, further comprising a gas manifold coupled to the ion source and configured to selectively provide one or more gases to the ion source to produce one or more corresponding ion beam components.

12. The system of claim 1, further comprising a display coupled to the control unit and configured to indicate presence of an unselected ion in the ion beam.

13. A system, comprising:
    a magnetic disperser configured to operate in an analysis mode and a zero mode;
    an ion beam column configured to direct an ion beam to a substrate;
    wherein in the analysis mode the magnetic disperser is energized to deflect the ion beam into one or more component beams;
    wherein the magnetic disperser is a magnetic stub, and wherein in the zero mode the magnetic stub is configured to mitigate remnant magnification to create a zero-field condition.

14. The system of claim 13, wherein the magnetic stub is configured to cancel remnant magnification.

15. A method, comprising:
   directing an ion beam to a substrate;
   operating a magnetic disperser in an analysis mode with an analysis excitation to selectively deflect at least one beam component of the ion beam;
   identifying the at least one beam component based on the deflection; and
   wherein the magnetic disperser is a charged particle beam (CPB) magnetic lens and the CPB is an electron beam, further comprising determining the composition and magnitude of the at least one beam component identified based on the deflection.

16. The method of claim 15, and further comprising applying an imaging excitation in an imaging mode and the analysis excitation in the analysis mode, wherein a magnitude of the imaging excitation is at least ten times greater than a magnitude of the analysis excitation.

17. The method of claim 15, further comprising deflecting the ion beam into one or more component beams in response to the analysis excitation and measuring a location of at least one deflected component beam, and further comprising measuring locations and currents associated with a plurality of deflected component beams.

18. The method of claim 15, further comprising, in the analysis mode, operating the ion beam to mill a substrate in locations corresponding to respective component beams, and identifying the component beams based on the milling.

19. The method of claim 15, further comprising, in the analysis mode, varying a magnitude of the analysis excitation and identifying at least one component of the ion beam based on a corresponding magnitude of the analysis excitation.

20. A method, comprising:
   providing a dual-beam system that includes a scanning electron microscope (SEM) situated to image a substrate and a focused ion beam (FIB) source situated to direct an ion beam to the substrate, the SEM comprising a magnetic objective lens situated to direct an electron beam to the substrate to produce an image of the substrate based on auxiliary radiation from the substrate in response to the electron beam;
   activating an analysis mode of the magnetic objective lens to generate an analysis magnetic field;
   activating the ion beam column with the analysis mode active and milling at least one spot on the substrate; and
   determining one or more components of the ion beam based on deflection of the ion beam components.

* * * * *